United States Patent
Zhu et al.

(10) Patent No.: US 12,040,193 B2
(45) Date of Patent: *Jul. 16, 2024

(54) EFFICIENT CLEANING AND ETCHING OF HIGH ASPECT RATIO STRUCTURES

(71) Applicant: LAM RESEARCH CORPORATION, Fremont, CA (US)

(72) Inventors: Ji Zhu, Castro Valley, CA (US); Mark Kawaguchi, San Carlos, CA (US); Nathan Musselwhite, San Jose, CA (US)

(73) Assignee: LAM RESEARCH CORPORATION, Fremont, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/963,615

(22) Filed: Oct. 11, 2022

(65) Prior Publication Data

US 2023/0035732 A1    Feb. 2, 2023

Related U.S. Application Data

(63) Continuation of application No. 16/973,489, filed as application No. PCT/US2019/036015 on Jun. 7, 2019, now Pat. No. 11,488,831.

(Continued)

(51) Int. Cl.
*H01L 21/306* (2006.01)
*H01L 21/02* (2006.01)

(52) U.S. Cl.
CPC .. *H01L 21/30604* (2013.01); *H01L 21/02057* (2013.01)

(58) Field of Classification Search
CPC ......... H01L 21/30604; H01L 21/02057; H01L 21/02244; H01L 21/32134;
(Continued)

(56) References Cited

U.S. PATENT DOCUMENTS

| 5,078,832 A | 1/1992 | Tanaka |
| 5,749,975 A | 5/1998 | Li et al. |

(Continued)

FOREIGN PATENT DOCUMENTS

| JP | S61148820 A | 7/1986 |
| JP | H03080538 A | 4/1991 |

(Continued)

OTHER PUBLICATIONS

Japanese Office Action for corresponding Japanese Application No. 2020-569191 mailed Jun. 27, 2023.

(Continued)

*Primary Examiner* — Duy Vu N Deo

(57) ABSTRACT

A method for treating a substrate includes arranging a substrate in a processing chamber. At least one of a vaporized solvent and a gas mixture including the solvent is supplied to the processing chamber to form a conformal liquid layer of the solvent on exposed surfaces of the substrate. The at least one of the vaporized solvent and the gas mixture is removed from the processing chamber. A reactive gas including a halogen species is supplied to the processing chamber. The conformal liquid layer adsorbs the reactive gas to form a reactive liquid layer that etches the exposed surfaces of the substrate.

16 Claims, 4 Drawing Sheets

Related U.S. Application Data

(60) Provisional application No. 62/684,415, filed on Jun. 13, 2018.

(58) Field of Classification Search
CPC ......... H01L 21/02043; H01L 21/02263; H01L 21/02307; H01L 21/02312; H01L 21/02337; H01L 21/02343; H01L 21/324
USPC .................................................. 438/745, 746
See application file for complete search history.

(56) References Cited

U.S. PATENT DOCUMENTS

| | | | |
|---|---|---|---|
| 7,378,355 B2 | 5/2008 | Bergman et al. | |
| 8,187,486 B1 | 5/2012 | Liu et al. | |
| 10,825,659 B2 | 11/2020 | Treadwell et al. | |
| 11,488,831 B2* | 11/2022 | Zhu | H01L 21/32134 |
| 2008/0011332 A1* | 1/2008 | Bailey | H01L 21/6708 |
| | | | 134/56 R |
| 2011/0033367 A1* | 2/2011 | Riehl | C01B 32/16 |
| | | | 977/840 |
| 2016/0111342 A1 | 4/2016 | Huang et al. | |
| 2016/0308112 A1 | 10/2016 | Tan et al. | |
| 2017/0032982 A1 | 2/2017 | Drewery et al. | |
| 2017/0256416 A1 | 9/2017 | Fischer et al. | |
| 2018/0019387 A1 | 1/2018 | Tan et al. | |
| 2018/0182634 A1 | 6/2018 | Smith et al. | |
| 2018/0374712 A1 | 12/2018 | Guha et al. | |
| 2019/0198345 A1 | 6/2019 | Fischer et al. | |
| 2019/0318941 A1* | 10/2019 | Xu | H01L 21/67028 |

FOREIGN PATENT DOCUMENTS

| | | |
|---|---|---|
| JP | H04097526 A | 3/1992 |
| JP | 2003289101 A | 10/2003 |
| JP | 2009060145 A | 3/2009 |
| JP | 2012238711 A | 12/2012 |
| JP | 2017157836 A | 9/2017 |
| KR | 1020160124689 A | 10/2016 |
| TW | 201812913 A | 4/2018 |
| WO | WO-2004001808 A2 | 12/2003 |
| WO | WO-2016172740 A2 | 10/2016 |
| WO | WO-2017099718 A1 | 6/2017 |

OTHER PUBLICATIONS

International Search Report and Written Opinion of the ISA issued in PCT/US2019/036015, mailed Sep. 27, 2019; ISA/KR.

* cited by examiner

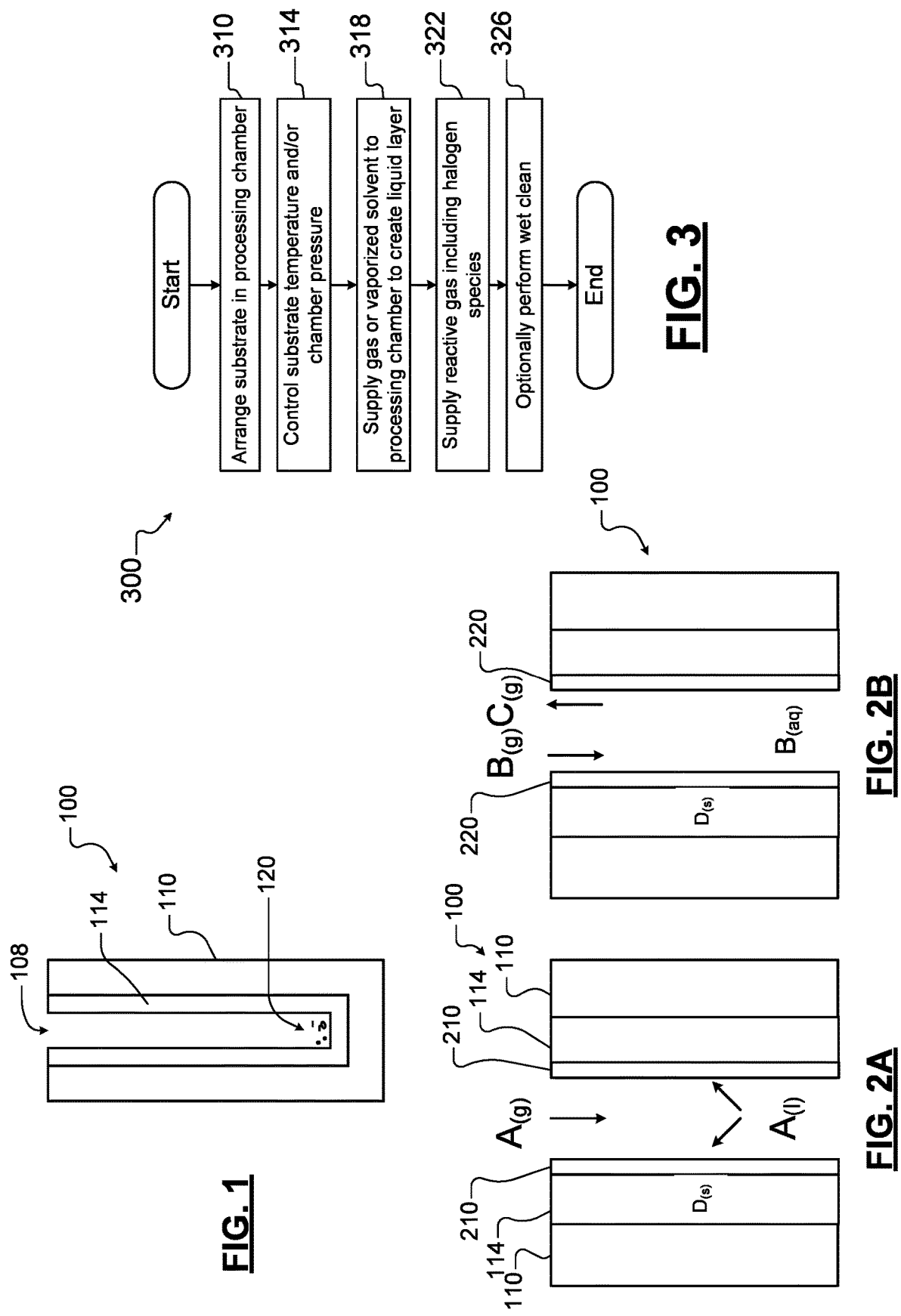

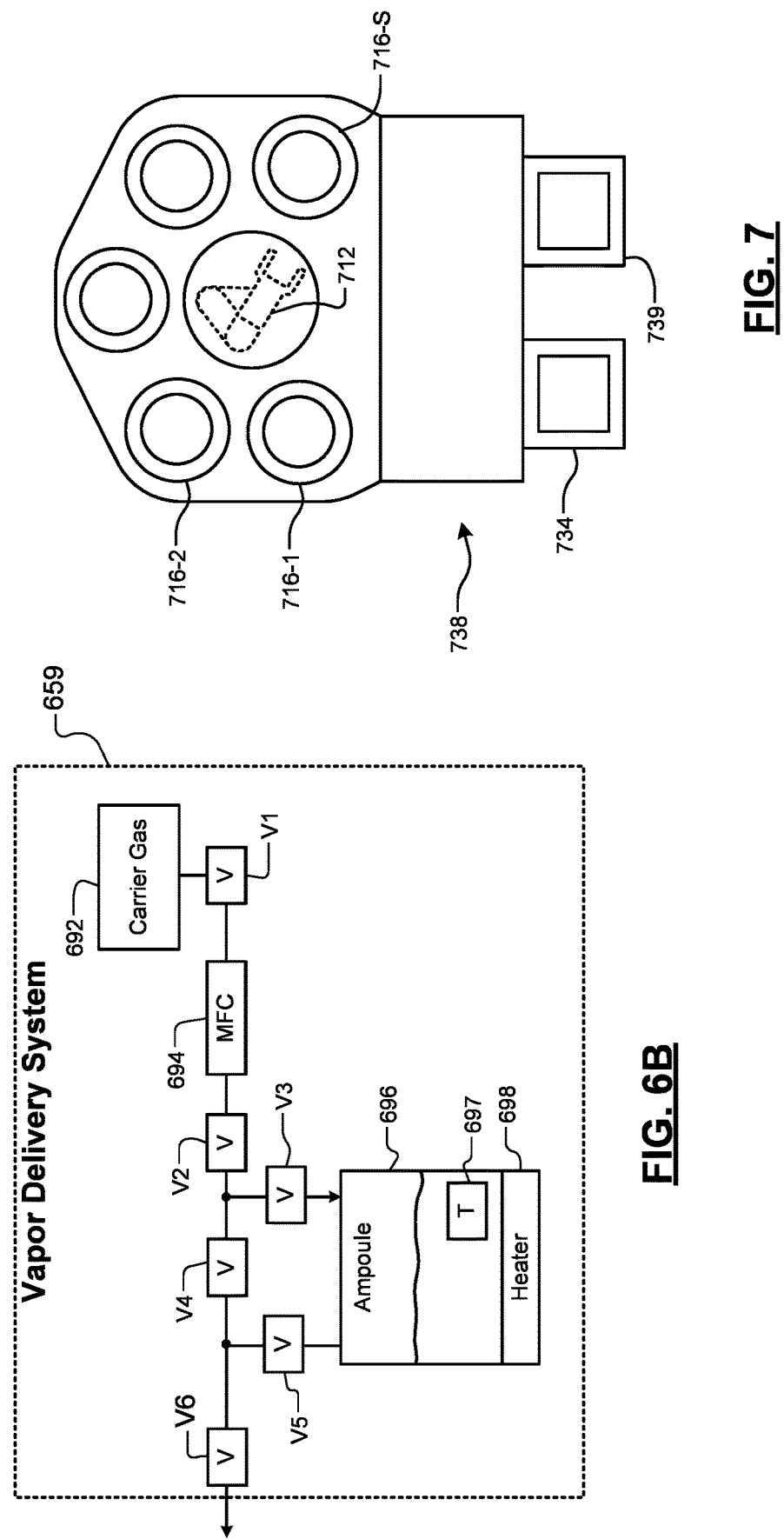

EFFICIENT CLEANING AND ETCHING OF HIGH ASPECT RATIO STRUCTURES

CROSS-REFERENCE TO RELATED APPLICATIONS

This application is a continuation of U.S. application Ser. No. 16/973,489, filed on Dec. 9, 2020, which is a U.S. National Phase Application under 35 U.S.C. 371 of International Application No. PCT/US2019/036015, filed on Jun. 7, 2019, which claims the benefit of U.S. Provisional Application No. 62/684,415, filed on Jun. 13, 2018. The entire disclosures of the applications referenced above are incorporated herein by reference.

FIELD

The present disclosure relates to methods for processing substrates and more particularly to methods for efficiently cleaning and etching substrates including high aspect ratio (HAR) structures.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Fabrication of substrates such as semiconductor wafers typically requires multiple processing steps that may include material deposition, planarization, feature patterning, feature etching, and/or feature cleaning. These processing steps are typically repeated one or more times during processing of the substrate. As semiconductor devices continue to scale down to smaller feature sizes, high aspect ratio (HAR) structures such as vias and trenches are increasingly required to achieve desired device performance objectives. The HAR structures pose challenges to wet clean and wet etch efficiency due to reduced diffusion and surface charge layer overlap in geometrically confined spaces.

SUMMARY

A method for treating a substrate includes a) arranging a substrate in a processing chamber; b) supplying at least one of a vaporized solvent and a gas mixture to the processing chamber to form a conformal liquid layer of the solvent on exposed surfaces of the substrate; c) removing the at least one of the vaporized solvent and the gas mixture from the processing chamber; and d) supplying a reactive gas including a halogen species to the processing chamber. The conformal liquid layer adsorbs the reactive gas to form a reactive liquid layer that etches the exposed surfaces of the substrate.

In other features, the reactive liquid layer reacts with the exposed surfaces of the substrate to create a gas product. The exposed surfaces of the substrate are etched without forming residue. The at least one of the vaporized solvent and the gas mixture is selected from a group consisting of a polar solvent, water, peroxide, isopropyl alcohol, acetone, carbon tetrachloride, hexane, methanol, and ethanol.

In other features, the reactive gas is selected from a group consisting of hydrogen fluoride gas, hydrogen chloride gas and hydrogen bromide gas. The substrate includes a plurality of high aspect ratio (HAR) features having a depth to width that is greater than or equal to 5:1.

In other features, prior to supplying the at least one of the vaporized solvent and the gas mixture to the processing chamber, setting a pressure in the processing chamber to a pressure range from 1 Torr to 10 Torr. Prior to supplying the at least one of the vaporized solvent and the gas mixture to the processing chamber, setting processing temperature in the processing chamber to a temperature range from 0 C.° to 400° C. Prior to supplying the at least one of the vaporized solvent and the gas mixture to the processing chamber, setting processing temperature in the processing chamber to a temperature range from 150 C.° to 400° C.

In other features, the reactive liquid layer etches the exposed surface at an etch rate in a range from 10 Angstroms/min to 100 Angstroms/min. In other features, the method includes performing a plurality of cycles including a) to d).

In other features, the reactive liquid layer etches the exposed surface 0.2 Angstroms to 1 Angstrom during each cycle of the plurality of cycles. In other features, the method includes, prior to b), supplying an oxidizing gas to the processing chamber for a predetermined period and evacuating the oxidizing gas.

In other features, the oxidizing gas includes a gas selected from a group consisting of molecular oxygen, ozone, hydrogen peroxide, nitrous oxide and nitrogen dioxide. The oxidizing gases are supplied with remote plasma. The oxidizing gases are supplied at a processing temperature in a range from 100° C. to 400° C.

In other features, the method includes performing wet cleaning of the substrate after d). The reactive liquid layer reacts with the exposed surfaces of the substrate to create a gas product. The exposed surfaces of the substrate are etched without forming residue. In other features, a) to d) are performed in an inductively coupled plasma (ICP) chamber.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1 is a side cross-sectional view of an example of a substrate including high aspect ratio (HAR) structures;

FIGS. 2A and 2B are side cross-sectional views of an example of the substrate during cleaning or etching of the substrate according to the present disclosure;

FIG. 3 is a flowchart of an example of a method for cleaning or etching of the substrate according to the present disclosure;

FIGS. 6A and 6B are functional block diagrams of a processing chamber according to the present disclosure; and FIG. 7 is a functional block diagram of a substrate processing tool including at least one processing chamber for cleaning and etching according to the present disclosure.

DETAILED DESCRIPTION

Figure 4A:
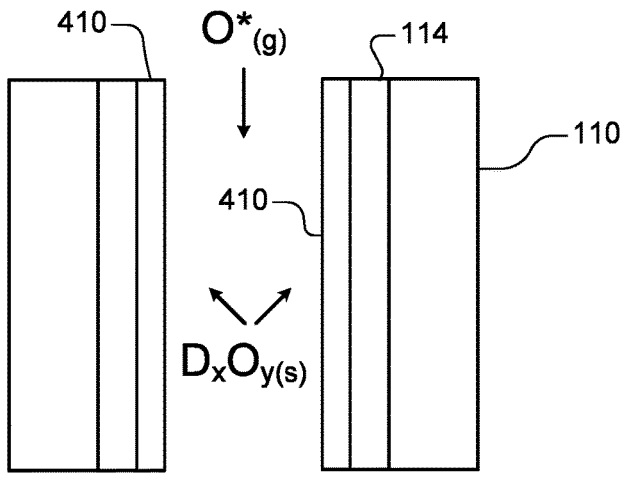
FIGS. 4A to 4C are side cross-sectional views of the substrate during cleaning or etching of the substrate according to the present disclosure.

As feature sizes shrink in advanced process nodes, high aspect ratio (HAR) structures are becoming more common. As used herein, HAR structures refer to features having aspect ratios greater than 5:1, 10:1 or 20:1. The HAR structures pose challenges to wet clean and wet etch efficiency due to reduced diffusion and surface charge layer overlap in geometrically confined spaces. A method according to the present disclosure overcomes this challenge using gas or vapor phase pre-treatment to generate an adsorbed liquid layer that conformally coats the HAR structures and improves subsequent cleaning and removal efficiency.

Materials diffuse much faster (on the order of $\times 10^4$ faster) in the gas or vapor phase as compared to the liquid phase. The methods described herein form a liquid layer of adsorbed reactive species on the HAR structures from the gas phase or the vapor phase. Due to the adsorbed liquid layer, chemical reactions are able to modify the underlying residue or films on the surface of the substrate and improve cleaning efficiency for the residue or etch efficiency of the film.

In some examples, the process is performed in a vacuum chamber at vacuum with controlled vapor exposure at a pre-determined temperature. In some examples, the pressure is in a range from 1T to 10 T. In some examples, the substrate temperature is maintained in a range from 0° C. to 400° C. during etching or cleaning. In some examples, the substrate temperature is maintained in a range from 150° C. to 400° C. during etching or cleaning. In other examples, the process is performed at atmospheric pressure in a processing chamber. Whether or not a vacuum chamber is used may be determined by the volatility of the solvent at different process temperatures and/or pressures that are used during the cleaning or etching steps. If the solvent is not volatile at atmospheric pressure, a vacuum chamber can be used.

The method according to the present disclosure is similar to atomic layer etching (ALE) in that reactants are introduced in the gas or vapor phase. However, in ALE, the adsorbed layer is mostly a monolayer and etching stops at a monolayer reaction. As a result, the etch rate is slow, e.g. on the order of 0.2 A to 1 A of material per cycle. In addition, ALE processes do not address cleaning efficiency. The method according to the present disclosure provides a higher etch rate. In some examples, the etch rate is on the order of ~10 A/min to 100 A/min. Another advantage of the method according to the present disclosure is the inherently high selectivity as compared to wet clean chemistry. The condensed liquid layer acts effectively like a liquid in wet clean chemistry.

Referring now to FIG. 1, a substrate 100 includes a first layer 110 and a second layer 114 deposited on the first layer 110. The substrate 100 includes a plurality of high aspect ratio (HAR) structures 108 that are defined in the first layer 110 and the second layer 114. For example, particles or residue 120 may be located at a bottom portion of the HAR structures 108 after a prior processing step and may need to be removed. The particles or residue 120 may be difficult to remove during cleaning due to the depth of the HAR structures.

Referring now to FIGS. 2A and 2B, during cleaning and/or etching processes, the substrate 100 is exposed to a gas mixture or a vaporized solvent A(g), where A is the solvent. For example, the substrate 100 may be controlled to a differential temperature relative to other components in the processing chamber (e.g. the substrate 100 is maintained at a lower temperature). The solvent 100 can be introduced into the processing chamber as a gas mixture that condenses as a liquid on the substrate 100. Alternately, gas vapor can be supplied to the processing chamber.

In FIG. 2A, the gas or vapor condenses on the second layer 114 and forms a conformal liquid layer 210 (which is adsorbed on an exposed surface of the second layer 114 as shown). In some examples, the solvent is selected from a group consisting of a polar solvent, water ($H_2O$), peroxide ($H_2O_2$), isopropyl alcohol ($C_3H_8O$ or IPA), acetone (($CH_3)_2CO$), carbon tetrachloride ($CCl_4$), hexane ($C_6H_{14}$), methanol ($CH_3OH$ or MeOH), ethanol ($C_2H_6O$ or EtOH) and/or other suitable solvent. In some examples, the solvent that is used is selected based on the film material of the second layer 114 that is to be cleaned or etched.

Subsequently, the substrate 100 is exposed to a reactive gas B(g), where B includes a halogen species such as fluorine (F), chlorine (Cl) or bromine (Br) as shown in FIG. 2B. In some examples, the reactive gas includes hydrogen fluoride gas (HF), hydrogen chloride gas (HCl) or hydrogen bromide (HBr) gas. The reactive species is adsorbed by the liquid layer 210 to create a reactive liquid layer 220 including the reactive species. The reactive liquid layer 220 cleans or etches the second layer 114 during an etch period or clean period. The reaction by product formed is in the gas phase and leaves the HAR without forming any residue, as indicated by gas C(g).

In some examples, such as during cleaning, a wet clean step may be performed after exposure to the reactive species in the reactive liquid layer 220. In some examples, the wet clean step uses mild chemistry. In some examples, the wet clean step includes rinsing the substrate with deionized water (DIW) or ozone dissolved deionized water ($DIO_3$).

Referring now to FIG. 3, a method 300 for cleaning or etching of the substrate is shown. At 310, the substrate is arranged in a processing chamber. At 314, substrate temperature and/or chamber pressure are controlled. At 318, a gas mixture and/or vaporized solvent are supplied to the processing chamber for a first predetermined period. The gas mixture and/or vaporized solvent are adsorbed onto the exposed surface of the second layer 114 as a liquid layer. At 322, a reactive gas is supplied to the processing chamber for a second predetermined period. In some examples, the reactive gas includes a halogen species. The substrate is exposed to the liquid layer including the reactive species for a third predetermined period sufficient for cleaning and/or etching. At 326, a wet clean step may optionally be performed after the cleaning or etching step. The process can be repeated one or more times.

Figure 4B:
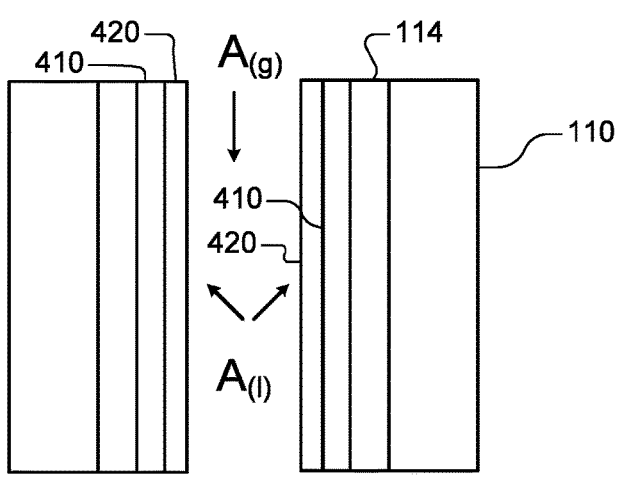
Figure 4C:
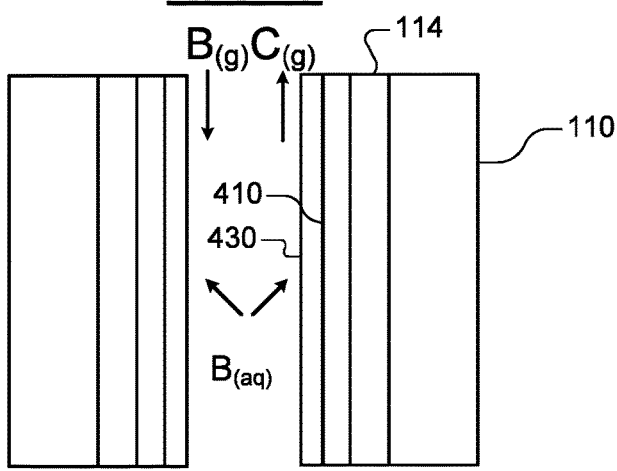

Referring now to FIGS. 4A to 4C, the substrate 100 of FIG. 1 may be cleaned or etched using another process. The substrate 100 is exposed to an oxidizing gas mixture in FIG. 4A, which oxidizes an exposed surface of the second layer 114 as shown at 410. In FIG. 4B, the substrate 100 is optionally exposed to a gas mixture or a vaporized solvent A(g) prior to exposure to reactive gas B(g). The gas mixture or vaporized solvent condenses on the second layer 114 to create a conformal liquid layer 420. In some examples, the solvent is selected from a group consisting of a polar solvent, water ($H_2O$), peroxide ($H_2O_2$), isopropyl alcohol ($C_3H_8O$ or IPA), acetone (($CH_3)_2CO$), carbon tetrachloride ($CCl_4$), hexane ($C_6H_{14}$), methanol ($CH_3OH$ or MeOH) and/or ethanol ($C_2H_6O$ or EtOH).

Subsequently, the substrate 100 is exposed to a reactive gas B(g), where B includes a halogen species such as fluorine (F), chlorine (Cl) or bromine (Br) as shown in FIG. 4C. The reactive species is adsorbed by the liquid layer 420 to create a liquid layer 430 including the reactive species. The liquid layer 430 cleans or etches the second layer 114 during a cleaning period or etch period, respectively. The reaction by product formed is in the gas phase and leaves the HAR without forming any residue, as indicated by gas C(g).

In some examples, such as during cleaning, a simple wet clean step may be performed after exposure to the reactive species (in the liquid layer 430) using mild chemistry (as compared to other clean steps such as sulfuric peroxide mixtures (SPM)). In some examples, the simple wet clean may include rinsing the substrate with deionized water (DIW) or ozone dissolved deionized water ($DIO_3$).

Figure 5:
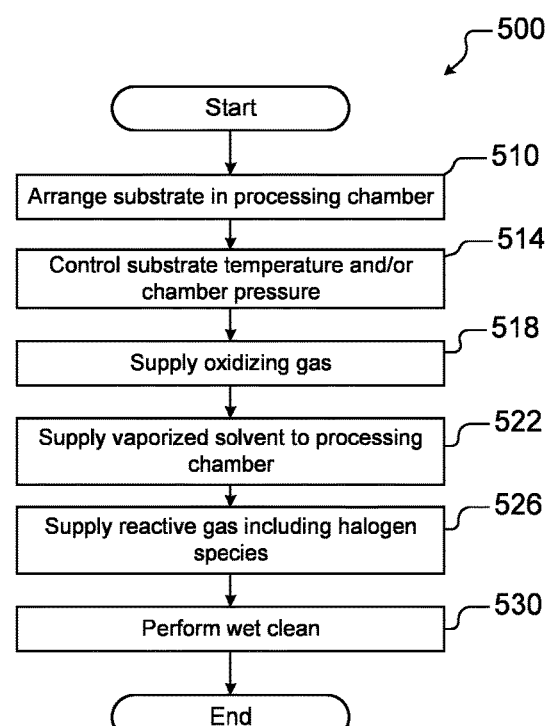
FIG. 5 is a flowchart of an example of a method for cleaning or etching of the substrate according to the present disclosure.

Referring now to FIG. 5, a method 500 for cleaning or etching of the substrate is shown. At 510, the substrate is arranged in a processing chamber. At 514, substrate temperature and/or chamber pressure are controlled. At 518, an oxidizing gas is supplied to the processing chamber during a first predetermined period. In some examples, the oxidizing gas includes molecular oxygen ($O_2$), ozone ($O_3$), peroxide ($H_2O_2$), nitrous oxide ($N_2O$), nitrogen dioxide ($NO_2$), although other oxidizing gases can be used. The oxidizing gases can be supplied with remote plasma using a remote plasma source (RPS) or using thermal reactions at elevated processing chamber temperatures. In some examples, the elevated processing chamber temperatures are in a range from 100° C. to 400° C. In some examples, the elevated temperatures for $O_2$, $O_3$ and $H_2O_2$ are in a range from 50° C. to 250° C. In some examples, the elevated temperatures for $N_2O$ and $NO_2$ are in a range from 200° C. to 400° C.

At optional step 522, gas and/or vaporized solvent are supplied to the processing chamber fora second predetermined period. The gas and/or vaporized solvent are adsorbed onto the exposed surface of the second layer 114 as a liquid layer. At 526, a reactive gas is supplied to the processing chamber for a third predetermined period. The reactive gas includes a halogen species. The substrate is exposed to the liquid layer including the reactive species for a fourth predetermined period sufficient for cleaning and/or etching. At 530, a wet clean step may optionally be performed. The process can be repeated one or more times as needed.

In one example, the method of FIG. 5 is used to selectively etch TiN/TiSiN film. In this example, the oxidation gas is supplied using thermal oxidation ($O_3$ or $O_2/N_2$) or remote inductively coupled plasma (ICP) ($O_2$ or $O_2/N_2$). The oxidation step creates a $TiO_2$ layer. The solvent includes an alcohol such as IPA, MeOH or EtOH. The reactive gas includes HCl, HF or HBr. The $TiO_2$ is converted into $TiCl_x$, $TiF_y$, or $TiBr_z$ (where x, y and z are integers), which is volatile.

Advantages of the method described in FIG. 5 include higher cleaning efficiency. Gas diffusion is on the order of $\sim 10^4$ higher than liquid diffusion and there are no Debye length constraints. The process is limited by oxidation thickness, which provides uniformity control. Additional thickness can be removed by cycling the process one or more times.

Figure 6A:
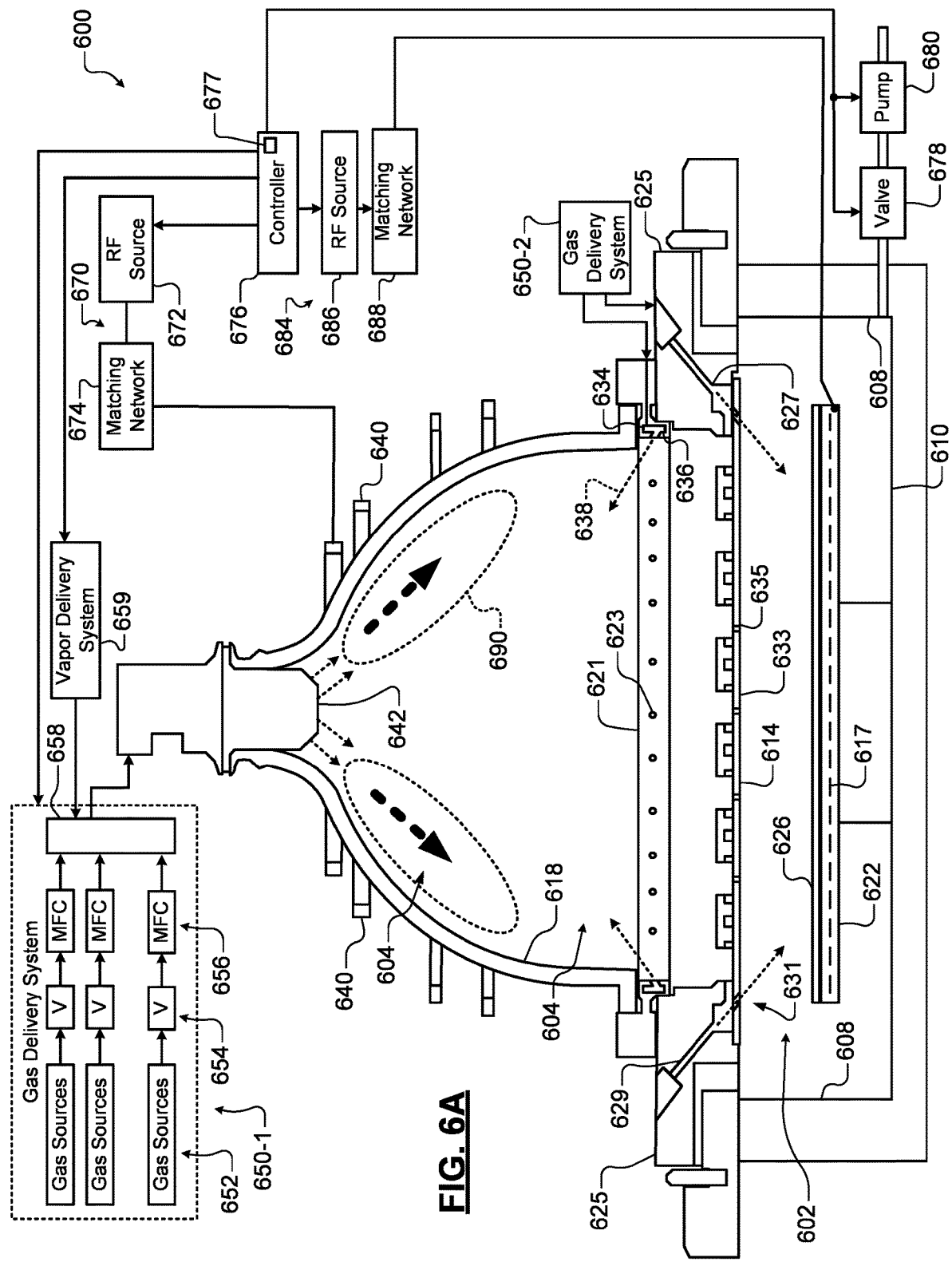

Referring now to FIG. 6A, an example of a substrate processing chamber 600 for performing etching or cleaning at vacuum is shown. While a specific substrate processing chamber is shown and described, the methods may be implemented using other types of substrate processing systems. For example, a substrate processing system operating at atmospheric pressure can be used. The substrate processing chamber 600 includes a lower chamber region 602 and an upper chamber region 604. The lower chamber region 602 is defined by chamber sidewall surfaces 608, a chamber bottom surface 610 and a lower surface of a gas distribution device 614.

The upper chamber region 604 is defined by an upper surface of the gas distribution device 614 and an inner surface of a dome 618. In some examples, the dome 618 rests on a first annular support 621. In some examples, the first annular support 621 includes one or more spaced holes 623 for delivering process gas to the upper chamber region 604. In some examples, the process gas is delivered by the one or more spaced holes 623 in an upward direction at an acute angle relative to a plane including the gas distribution device 614, although other angles/directions may be used. In some examples, a gas flow channel 634 in the first annular support 621 supplies gas to the one or more spaced holes 623.

The first annular support 621 may rest on a second annular support 625 that defines one or more spaced holes 627 for delivering process gas from a gas flow channel 629 to the lower chamber region 602. In some examples, holes 631 in the gas distribution device 614 align with the holes 627. In other examples, the gas distribution device 614 has a smaller diameter and the holes 631 are not needed. In some examples, the process gas is delivered by the one or more spaced holes 627 in a downward direction towards the substrate at an acute angle relative to the plane including the gas distribution device 614, although other angles/directions may be used.

In other examples, the upper chamber region 604 is cylindrical with a flat top surface and one or more flat inductive coils may be used. In still other examples, a single chamber may be used with a spacer located between a showerhead and the substrate support.

A substrate support 622 is arranged in the lower chamber region 604. In some examples, the substrate support 622 includes an electrostatic chuck (ESC), although other types of substrate supports can be used. A substrate 626 is arranged on an upper surface of the substrate support 622 during etching. In some examples, a temperature of the substrate 626 may be controlled by a heater plate 617, an optional cooling plate with fluid channels and one or more sensors (not shown); although any other suitable substrate support temperature control system may be used.

In some examples, the gas distribution device 614 includes a showerhead (for example, a plate 633 having a plurality of spaced holes 635). The plurality of spaced holes 635 extend from the upper surface of the plate 633 to the lower surface of the plate 633. In some examples, the spaced holes 635 have a diameter in a range from 0.1" to 0.75". In some examples, the showerhead is made of a conducting material such as aluminum or a non-conductive material such as ceramic with an embedded electrode made of a conducting material.

One or more inductive coils 640 are arranged around an outer portion of the dome 618. When energized, the one or more inductive coils 640 create an electromagnetic field inside of the dome 618. In some examples, an upper coil and a lower coil are used. A gas injector 642 injects one or more gas mixtures from a gas delivery system 650-1.

In some examples, a gas delivery system 650-1 includes one or more gas sources 652, one or more valves 654, one or more mass flow controllers (MFCs) 656, and a mixing manifold 658, although other types of gas delivery systems may be used. A vapor delivery system 659 delivers vapor including a carrier gas and another gas to the processing chamber.

A gas splitter (not shown) may be used to vary flow rates of a gas mixture. Another gas delivery system 650-2 may be used to supply an etch gas or an etch gas mixture to the gas flow channels 629 and/or 634 (in addition to or instead of etch gas from the gas injector 642).

Suitable gas delivery systems are shown and described in commonly assigned U.S. patent application Ser. No. 14/945, 680, entitled "Gas Delivery System" and filed on Dec. 4, 2015, which is hereby incorporated by reference in its entirety. Suitable single or dual gas injectors and other gas injection locations are shown and described in commonly assigned U.S. Provisional Patent Application Ser. No. 62/275,837, entitled "Substrate Processing System with Multiple Injection Points and Dual Injector" and filed on Jan. 7, 2016, which is hereby incorporated by reference in its entirety.

In some examples, the gas injector 642 includes a center injection location that directs gas in a downward direction and one or more side injection locations that inject gas at an angle with respect to the downward direction. In some examples, the gas delivery system 650-1 delivers a first portion of the gas mixture at a first flow rate to the center injection location and a second portion of the gas mixture at a second flow rate to the side injection location(s) of the gas injector 642. In other examples, different gas mixtures are delivered by the gas injector 642. In some examples, the gas delivery system 650-1 delivers tuning gas to the gas flow channels 629 and 634 and/or to other locations in the processing chamber as will be described below.

A plasma generator 670 may be used to generate RF power that is output to the one or more inductive coils 640. Plasma 690 is generated in the upper chamber region 604. In some examples, the plasma generator 670 includes an RF source 672 and a matching network 674. The matching network 674 matches an impedance of the RF source 672 to the impedance of the one or more inductive coils 640. In some examples, the gas distribution device 614 is connected to a reference potential such as ground. A valve 678 and a pump 680 may be used to control pressure inside of the lower and upper chamber regions 602, 604 and to evacuate reactants.

A controller 676 communicates with the gas delivery systems 650-1 and 650-2, the valve 678, the pump 680, and/or the plasma generator 670 to control flow of process gas, purge gas, RF plasma and chamber pressure. In some examples, plasma is sustained inside the dome 618 by the one or more inductive coils 640. One or more gas mixtures are introduced from a top portion of the chamber using the gas injector 642 (and/or holes 623) and plasma is confined within the dome 618 using the gas distribution device 614.

In some examples, an RF bias 684 is provided and includes an RF source 686 and an optional matching network 688. The RF bias power can be used to create plasma between the gas distribution device 614 and the substrate support or to create a self-bias on the substrate 626 to attract ions. The controller 676 may be used to control the RF bias power.

Referring now to FIG. 6B, the vapor delivery system 659 can include a bubbler or an ampoule. The vapor delivery system 659 includes a carrier gas source 692 that is connected by a valve V1 to a mass flow controller 694. The vapor delivery system 659 further includes valves V2, V3, V4, V5 and V6 that are configured to prevent flow or to control flow of carrier gas or a mixture of the carrier gas and the solvent. A temperature sensor 697 and a heater 698 are used to control a temperature of the solvent in an ampoule 696. Carrier gas can be supplied by opening valves P1, V2, V4, V5 and V6. Carrier gas and the solvent can be supplied by opening valves V1, V2, V3, V5 and V6 and closing valve V4.

Referring now to FIG. 7, a substrate processing tool 710 according to the present disclosure is shown. The substrate processing tool 710 includes a robot 712 arranged in a central location. The robot 712 may be operated at vacuum or atmospheric pressure. The substrate processing tool 710 includes a plurality of stations 716-1, 716-2, . . . , and 716-S (collectively stations 716) (where S is an integer greater than one) arranged around the robot 712. The stations 716 may be arranged around a center of the substrate processing tool 710 with an equal or irregular angular offset. Examples of stations 716 may include deposition, etch, pre-clean, post clean, spin clean, etc. The substrates may be initially located in a cassette 734. A robot and load lock generally identified at 738 may be used to move the substrates from the cassette 734 to the substrate processing tool 710. When processing is complete, the robot and load lock 738 may return the substrates to the cassette 734 and/or another cassette 739.

In some examples, one of the plurality of stations 716 performs deposition or etching. Another one of the plurality of stations 716 performs cleaning or etching described above. Another one of the plurality of stations such as a spin clean chamber performs the simple wet clean step described above. In some examples, the substrate is moved by the robot 712 from the deposition or etching station, to the cleaning or etching station, and then to the simple wet clean station.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for treating a substrate, comprising:
   a) arranging the substrate in a processing chamber; and
   b) concurrently supplying a vaporized solvent and a reactive gas including a halogen species to the processing chamber to form a conformal liquid layer on exposed surfaces of the substrate;
   wherein the conformal liquid layer adsorbs the reactive gas to form a reactive liquid layer that etches the exposed surfaces of the substrate forming a gaseous byproduct without forming residue.

2. The method of claim 1, wherein the reactive liquid layer reacts with the exposed surfaces of the substrate to create a gas product.

3. The method of claim 1, wherein an etch rate is in a range from 10 Angstroms/min to 100 Angstroms/min.

4. The method of claim 1, wherein the reactive gas is selected from a group consisting of hydrogen fluoride gas, hydrogen chloride gas and hydrogen bromide gas.

5. The method of claim 1, wherein the substrate includes a plurality of high aspect ratio (HAR) features having a depth to width that is greater than or equal to 5:1.

6. The method of claim 1, further comprising, prior to supplying the vaporized solvent and the reactive gas to the processing chamber, setting a pressure in the processing chamber to a pressure range from 1 Torr to 10 Torr.

7. The method of claim 1, further comprising, prior to supplying the vaporized solvent and the reactive gas to the processing chamber, setting processing temperature in the processing chamber to a temperature range from 0 C.° to 400° C.

8. The method of claim 1, further comprising performing a plurality of cycles including a) and b).

9. The method of claim 8, wherein the reactive liquid layer etches the exposed surfaces 0.2 Angstroms to 1 Angstrom during each cycle of the plurality of cycles.

10. The method of claim 1, further comprising:
prior to b):
supplying an oxidizing gas to the processing chamber for a predetermined period; and
evacuating the oxidizing gas.

11. The method of claim 10, wherein the oxidizing gas includes a gas selected from a group consisting of molecular oxygen, ozone, hydrogen peroxide, nitrous oxide and nitrogen dioxide.

12. The method of claim 10, wherein the oxidizing gas is supplied with remote plasma.

13. The method of claim 10, wherein the oxidizing gas is supplied at a processing temperature in a range from 100° C. to 400° C.

14. The method of claim 10, further comprising performing wet cleaning of the substrate after b).

15. The method of claim 1, wherein a) and b) are performed in an inductively coupled plasma (ICP) chamber.

16. The method of claim 1 further comprising controlling a temperature of the substrate at a differential temperature relative to other components of the processing chamber.

* * * * *